United States Patent
Kilroy et al.

(10) Patent No.: US 7,656,633 B2
(45) Date of Patent: Feb. 2, 2010

(54) ASYMMETRIC FAULT DETECTION AND PROTECTION WITH AC SOLID STATE POWER CONTROLLERS

(75) Inventors: Donald G. Kilroy, Rockford, IL (US); John Defenbaugh, Rockford, IL (US); Thomas Doubek, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 499 days.

(21) Appl. No.: 11/645,377

(22) Filed: Dec. 26, 2006

(65) Prior Publication Data

US 2008/0151451 A1 Jun. 26, 2008

(51) Int. Cl.
*H02H 3/08* (2006.01)
(52) U.S. Cl. ....................................... 361/93.2
(58) Field of Classification Search ............... 361/93.2
See application file for complete search history.

(56) References Cited

U.S. PATENT DOCUMENTS

| | | | |
|---|---|---|---|
| 4,203,040 A | | 5/1980 | Abbondanti et al. |
| 4,429,339 A | * | 1/1984 | Jaeschke et al. ............ 361/93.7 |
| 5,100,821 A | | 3/1992 | Fay |
| 5,831,807 A | * | 11/1998 | Masannek et al. .......... 361/93.2 |
| 5,892,677 A | | 4/1999 | Chang |
| 6,501,196 B1 | | 12/2002 | Lo |
| 6,995,995 B2 | * | 2/2006 | Zeng et al. ..................... 363/60 |
| 2007/0085135 A1 | * | 4/2007 | Tanaka ........................ 257/328 |

FOREIGN PATENT DOCUMENTS

| | | |
|---|---|---|
| DE | 10014641 | 10/2001 |
| EP | 0927981 | 7/1999 |

OTHER PUBLICATIONS

European Search Report dated Jun. 5, 2008.

* cited by examiner

*Primary Examiner*—Stephen W Jackson
*Assistant Examiner*—Ann T Hoang
(74) *Attorney, Agent, or Firm*—Carlson, Gaskey & Olds, P.C.

(57) ABSTRACT

An apparatus and method for protecting an AC load from half-wave rectified power detects a half-wave rectified voltage or current, sets a status indication indicating the type of asymmetric fault causing the half-wave rectified power, and selectively turns the SSPC ON or OFF depending on the type of fault. There are two example circumstances that can cause an asymmetric fault: when the SSPC is OFF and a switch is shorted ("SSPC Failed Shorted"), or when the SSPC is commanded ON and a switch remains open ("SSPC Failed Open"). If the SSPC is OFF when the half-wave rectified AC voltage or current is detected, an "SSPC Failed Shorted" status indication is set, and the SSPC is turned ON to clear the fault. If the SSPC is commanded ON when the half-wave rectified AC voltage or current is detected, an "SSPC Failed Open" status indication is set, and the SSPC is turned OFF to clear the fault.

13 Claims, 4 Drawing Sheets

ASYMMETRIC FAULT DETECTION AND PROTECTION WITH AC SOLID STATE POWER CONTROLLERS

BACKGROUND OF THE INVENTION

This application relates generally to vehicle power systems and, more particularly, to AC solid state power controls.

Vehicles, such as aircraft, require electrical wiring protection. The most common form of aircraft electrical wiring protection is a thermal circuit breaker. Also common is an all electronic switch or a solid state power controller (SSPC). An SSPC uses transistors to provide a switching function and uses electronics to provide a circuit breaker function. The SSPC has found widespread use because of its desirable status capability, reliability, and packaging density.

The usual waveform of AC electric power is a sine wave, which has both positive and negative portions. In half-wave rectified AC, either the positive or negative portions of the AC waveform are blocked. When distributing AC electrical power through an AC SSPC, fault modes exist that can result in half-wave rectified AC power being transmitted to a load. These fault modes are known as asymmetric faults. Half-wave rectified waveforms can damage aircraft circuitry and can create hazardous conditions for an aircraft.

There is a need for an SSPC that can detect asymmetric fault conditions and that can protect a load from a half-wave rectified AC power.

SUMMARY OF THE INVENTION

In the disclosed embodiments of this invention, an apparatus and method for protecting AC loads from a half-wave rectified power is provided. An SSPC detects a half-wave rectified voltage, sets a status indication indicating the type of asymmetric fault causing the half-wave rectified power, and selectively turns the SSPC ON or OFF depending on the type of asymmetric fault. There are two example circumstances that can cause an asymmetric fault: when the SSPC is OFF and a switch is shorted ("SSPC Failed Shorted"), or when the SSPC is commanded ON and a switch remains open ("SSPC Failed Open"). If the SSPC is OFF when the half-wave rectified AC is detected, an "SSPC Failed Shorted" status indication is set, and the SSPC is turned ON to clear the fault. If the SSPC is commanded ON when the half-wave rectified AC is detected, an "SSPC Failed Open" status indication is set, and the SSPC is turned OFF to clear the fault.

These and other features of the present invention can be best understood from the following specification and drawings, the following of which is a brief description.

DETAILED DESCRIPTION OF THE PREFERRED EMBODIMENT

Figure 1:
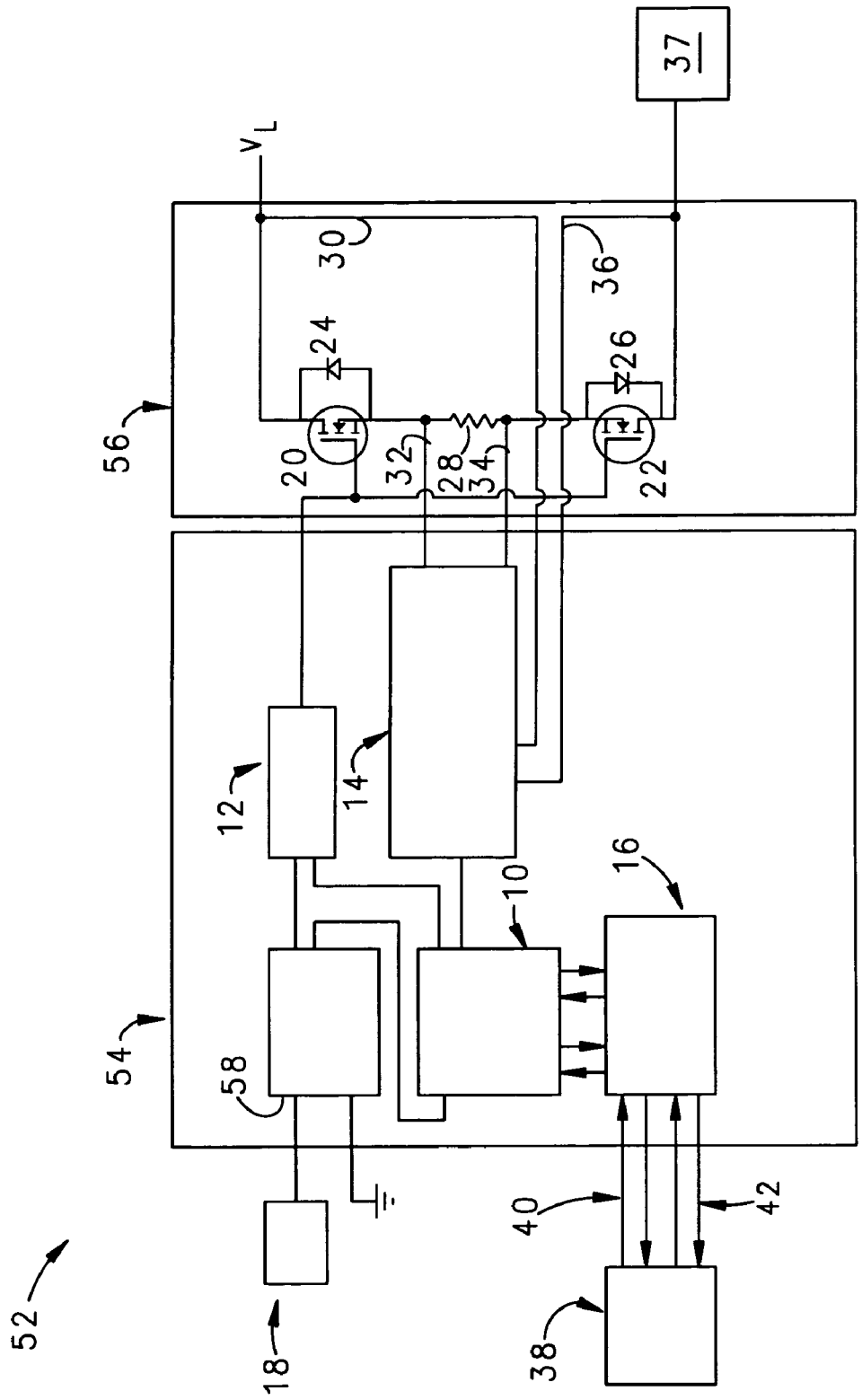
FIG. 1 illustrates a simplified AC solid state power controller according to one embodiment of the present invention.

FIG. 1 illustrates selected portions of an example solid state power controller (SSPC) 52 for use in a vehicle, such as an aircraft. In this example, the SSPC 52 includes a logic section 54 and a power section 56. The logic section 54 comprises a power supply 58, a microcontroller 10, a gate drive 12, a signal conditioning and logic module 14, and a communications interface 16. The power section 56 comprises a first switch 20 that has a reverse-biased intrinsic body diode 24, a current sense resistor 28, and a second switch 22 that has a forward-biased intrinsic body diode 26. Although body diodes 24 and 26 are not actual physical diodes, they behave as diodes in parallel to the switch with which they are associated. In one example, switches 20 and 22 can be MOSFETs.

The power supply 58 channels power from a power source 18 to the microcontroller 10 and the gate drive 12. The microcontroller 10 controls the gate drive 12, which opens and closes the first switch 20 and the second switch 22. When the gate drive 12 is turned on, the first switch 20 and the second switch 22 are closed and the SSPC power section 56 turns ON. When the gate drive 12 is turned off, the first switch 20 and the second switch 22 are opened and the SSPC power section 56 turns OFF. When the SSPC 52 is ON, and the switches 20 and 22 are closed, current with a normal AC waveform is transmitted to a load 37.

Figure 1A:
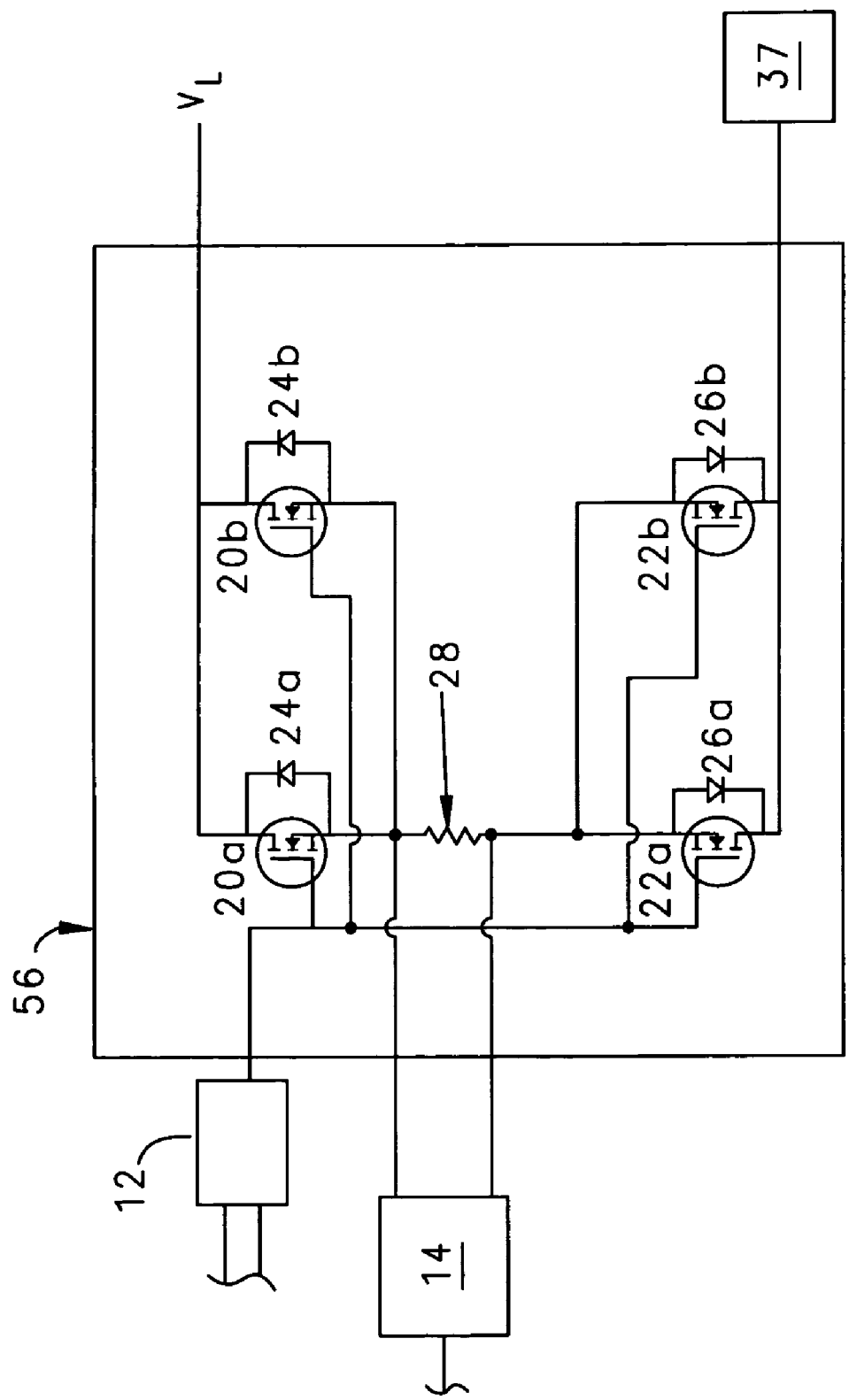
FIG. 1A illustrates a power section of a solid state power controller according to a second embodiment of the present invention.

As shown in FIG. 1A, it is possible that the first switch 20 and second switch 22 can be groups of switches. In the example shown in FIG. 1A, the first group of switches includes switch 20a and 20b, and body diodes 24a and 24b, and the second group of switches includes switches 22a and 22b and body diodes 26a and 26b. All switches in the first group are in parallel, and all switches in the second group are in parallel. The quantity of first switches is the same as the quantity of second switches. In addition, all switches in the first group have reverse-biased body diodes, and all switches in the second group have forward-biased body diodes. Of course, three or even more switches can be used in a group.

A signal conditioning and logic module 14 has four inputs 30, 32, 34, and 36. The signal conditioning and logic module 14 uses inputs 32 and 34 to sense current across the current sense resistor 28, and uses inputs 30 and 36 to detect voltage at the SSPC input and the SSPC load output. Microcontroller 10 transmits data to an external microprocessor module 38 via communications interface 16. Communications interface 16 transmits data to the microprocessor module 38 via redundant communication lines 40 and 42.

Even if switches 20 and 22 are open (SSPC is OFF), the body diodes 24 and 26 are still able to permit a flow of current. Body diode 24 is forward-biased with negative AC voltage. Thus, even if switch 20 is open, negative AC current will flow from the $V_{Line}$ input through the body diode 24 and through the current sense resistor 28. Body diode 26, however, is only forward-biased with positive AC voltage. Therefore, if both switches are off, and negative AC current flows through the body diode 24 and the current sense resistor 28, no current will flow to the load 37 because body diode 26 only permits a flow of positive AC current.

There are two example conditions in which an asymmetric fault can occur. In a first, "SSPC Failed Shorted" example fault condition, the SSPC power section 56 is OFF and one of the switches 20 or 22 is shorted. In this example, current flows through the shorted switch in series with the body diode of the open switch. If this failure is detected, then an "SSPC Failed Shorted", status indication is set in the microprocessor module 38. There are three example detection methods for an "SSPC Failed Shorted" fault condition. A first example detection method involves detecting a voltage on the output of the SSPC power section 56 when the SSPC power section 56 should be OFF, and determining if the voltage is greater than or equal to a threshold value. An example threshold value is 40 $V_{RMS}$. A second example detection method would involve performing a comparison between the $V_{Line}$ voltage and the voltage at the load output of the SSPC, and determining if the difference between these values, also known as a voltage drop, is greater than or equal to a threshold value. An example threshold value is 40 $V_{RMS}$. A third example detection method would involve performing a comparison between alternate half cycles of voltage or current and determining if the difference between these values is greater than or equal to a threshold value.

It is common for an SSPC to have a rating based upon the switches it contains. If the "SSPC Failed Shorted" fault detection is true and there is a current greater than or equal to a percentage of the SSPC rating, the SSPC 52 will override any existing switch commands and turn the output on. Using an example SSPC rating of 2.5 Amps and an example percentage of 10%, if the "SSPC Failed Shorted" fault detection is true and there is a current of 250 mA through the current sense resistor 28, the SSPC would resolve this asymmetric fault condition by turning ON. Once both the first switch 20 and second switch 22 are closed (SSPC ON), the half-wave rectified power will be eliminated as a regular AC waveform will flow to a load 37.

In a second, "SSPC Failed Open" example fault condition, the SSPC 52 is commanded ON, and one of the switches 20 or 22 remains open. In this example current flows through the closed switch in series with the body diode of the open switch. If this failure is detected, then an "SSPC Failed Open" status indication would be set in the microcontroller 10. There are two example detection methods for detecting this condition. A first example detection method for this condition would involve an increased voltage across the SSPC when the SSPC should be ON. This detection method involves performing a comparison between the $V_{Line}$ input voltage and the voltage at the output of the SSPC, and determining if the difference between these values, also known as a voltage drop, is greater than or equal to a threshold value. An example threshold value is 40 $V_{RMS}$. A second example detection method for this condition would involve measuring a voltage or current of alternating half cycles of AC, and evaluating the measurements. One example way of evaluating the measurements is to average the measured values, and determine if the average value is less than or equal a threshold value. An example threshold value is 100 $V_{RMS}$. In order to resolve the "SSPC Failed Open" fault condition, the microcontroller 10 would override existing switch commands and turn off the SSPC power section 56 by opening the first switch 20 and the second switch 22. This would remove the half-wave rectified power from the load output by permitting both the positive and negative portions of the AC current waveform to pass to a load 37.

A single SSPC typically handles only a single phase of AC. In an application requiring multiple phases of AC power, such as in an aircraft, it is possible to use multiple SSPCs. If one phase of a multi-phase AC waveform is open, this is an acceptable scenario, for aircraft loads can be designed to handle an open phase condition. However an aircraft load can not handle an "SSPC Failed Open" asymmetric fault, because of the high DC content that accompanies such a fault. Thus, it is therefore desirable to distinguish between an acceptable open phase and an unacceptable "SSPC Failed Open" asymmetric fault.

An example method of distinguishing between an open phase and an "SSPC Failed Open" asymmetric fault involves measuring the difference in voltage between an input voltage ($V_{Line}$) and an output voltage, and determining if the difference is greater than or equal to twice the value of an "SSPC Failed Open" threshold value, where the threshold value varies depending on the number of phases involved. If the difference is greater than, say twice the value of the threshold value, the fault is considered an open phase and no action is required of the SSPC 52. A second example method of distinguishing between an open phase and an "SSPC Failed Open" asymmetric fault involves measuring a voltage or current of alternating half cycles of AC, and evaluating the measurements.

In addition, although an SSPC is shown in FIG. 1, one skilled in the art could apply the various features and advantages of this invention to other electronic switching elements that use MOSFETs or devices with diodes.

Figure 2:
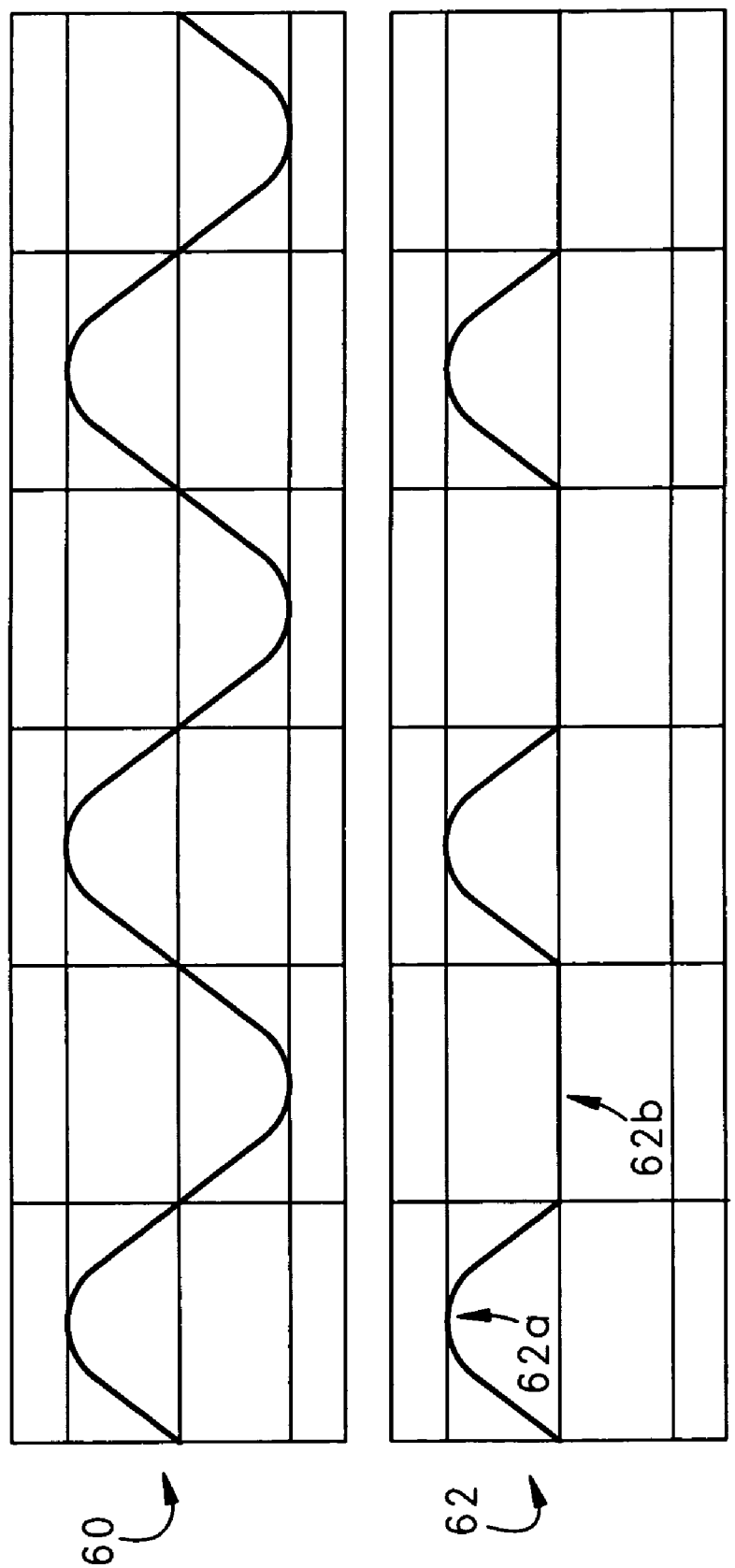
FIG. 2 illustrates a regular AC voltage or current waveform and a positive half-wave rectified AC voltage or current waveform.

FIG. 2 illustrates both a regular AC waveform 60 and a half-wave rectified AC waveform 62. The half-wave rectified waveform 62 is a positive half-cycle waveform, and corresponds to a condition in which current flows through the body diode 26 and through the first switch 20, which is either shorted or closed. The waveform 62 has both AC content 62a and DC content 62b. While not shown in FIG. 2, it is possible that negative half-wave rectified voltage can occur. If current flowed through the second switch 22, which was shorted or closed, and through the body diode 24, the waveform 62 would show a negative half-cycle. A negative half-wave rectified waveform would resemble waveform 62, except the positive peaks would be absent and negative peaks would be present.

Figure 3:
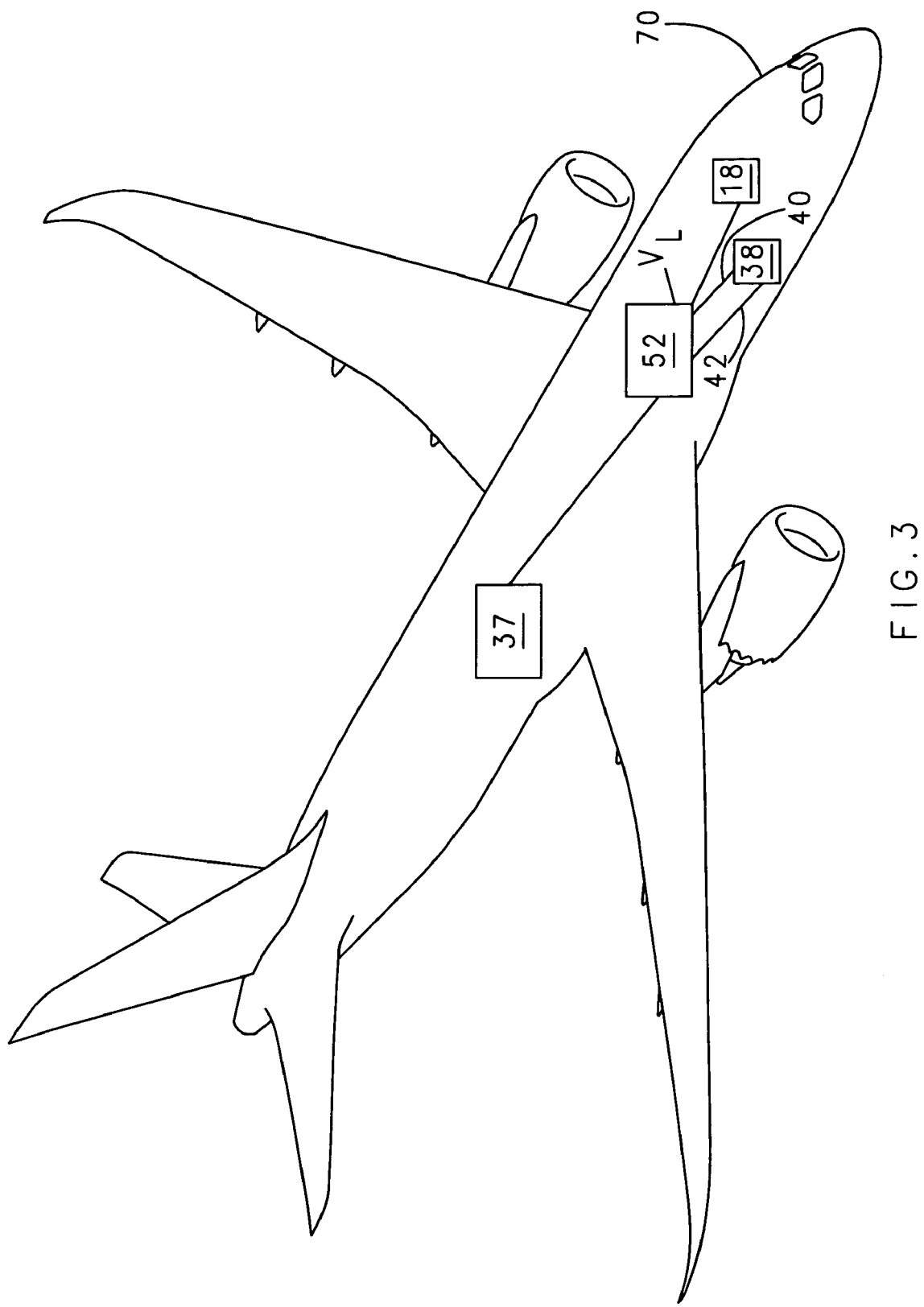
FIG. 3 illustrates one embodiment of the present invention in an example environment of an aircraft.

FIG. 3 illustrates one embodiment of the present invention in an example environment of an aircraft 70. An SSPC 52 uses a power source 18 to control a flow of current from $V_{Line}$ to a load 37. The SSPC 52 transmits data to a microprocessor module 38 via redundant communication lines 40 and 42.

While all example voltages have been RMS voltages, it is understood that peak voltage measurements could also be used for asymmetric fault detection. Further, it should be understood that specific values disclosed in this application are examples only, and are not intended to be limiting.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A solid state power controller comprising:
   at least one first switch;
   at least one second switch; and
   a controller, wherein the controller is operable to detect an asymmetric fault condition, wherein the controller is operable to either open or close the at least one first switch and the at least one second switch in response to the asymmetric fault condition, and wherein when the controller detects a shorted switch when the solid state power controller is OFF, the controller will turn the solid state power controller ON.

2. The solid state power controller of claim 1, wherein the at least one first switch is oriented to have an intrinsic body diode that is reverse-biased, and wherein the at least one first switch is coupled to an input voltage line, and the at least one second switch is oriented to have an intrinsic body diode that is forward-biased, and wherein the second switch is coupled to a load output.

3. The solid state power controller of claim 2, further including a current sense resistor.

4. The solid state power controller of claim 3, further including a signal conditioning and logic module, wherein the signal conditioning and logic module is operable to obtain current and voltage measurement data, and to send the measurement data to the controller.

5. The solid state power controller of claim 4, further including a gate drive coupled to the at least one first switch and the at least one second switch, wherein the gate drive is operable to receive commands from the controller to open or close the at least one first switch and the at least one second switch.

6. The solid state power controller of claim 1, further comprising:
   a plurality of first switches, wherein the plurality of first switches are in parallel; and
   a plurality of second switches, wherein the plurality of second switches are in parallel, and wherein there are an equal number of first and second switches.

7. The solid state power controller of claim 1, wherein the at least one first switch and at least one second switch are MOSFETs.

8. The solid state power controller of claim 1, wherein said controller detects an asymmetric fault condition by measuring an output voltage at an output of the solid state power controller, measuring an input voltage at an input of the solid state power controller, determining a voltage drop across the solid state power controller based on the input voltage and the output voltage, and detecting an asymmetric fault only when said determined voltage drop exceeds a threshold.

9. The solid state power controller of claim 1, wherein said controller detects an asymmetric fault condition by measuring a voltage at an output voltage of the solid state power controller, and detecting an asymmetric fault only when the output voltage is greater than or equal to a threshold.

10. The solid state power controller of claim 1, wherein said controller detects an asymmetric fault condition when a difference in alternate half cycles of voltage of the solid state power controller is greater than or equal to a threshold value.

11. The solid state power controller of claim 1, wherein said controller detects an asymmetric fault condition when a difference in alternate half cycles of current of the solid state power controller is greater than or equal to a threshold value.

12. A solid state power controller comprising:
   at least one first switch;
   at least one second switch; and
   a controller, wherein the controller is operable to detect an asymmetric fault condition, and wherein the controller is operable to either open or close the at least one first switch and the at least one second switch in response to the asymmetric, fault condition; and
   wherein an ON state of the solid state power controller corresponds to the at least one first switch and the at least one second switch being closed, and an OFF state of the solid state power controller corresponds to the at least one first switch and the at least one second switch being open, and wherein if the controller detects a shorted switch when the solid state power controller is OFF, the controller will turn the solid state power controller ON.

13. The solid state power controller of claim 12, wherein if the controller detects that a switch remains open when the solid state power controller is commanded ON, the controller will turn the solid state power controller OFF.

\* \* \* \* \*

UNITED STATES PATENT AND TRADEMARK OFFICE
CERTIFICATE OF CORRECTION

| | | |
|---|---|---|
| PATENT NO. | : 7,656,633 B2 | Page 1 of 1 |
| APPLICATION NO. | : 11/645377 | |
| DATED | : February 2, 2010 | |
| INVENTOR(S) | : Kilroy et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 537 days.

Signed and Sealed this

Fourth Day of January, 2011

David J. Kappos
*Director of the United States Patent and Trademark Office*